United States Patent [19]
Fletcher

[11] Patent Number: 4,703,396
[45] Date of Patent: Oct. 27, 1987

[54] LATCH FOR PRINTED CIRCUIT BOARD

[75] Inventor: James D. Fletcher, Lititz, Pa.

[73] Assignee: RCA Corporation, Princeton, N.J.

[21] Appl. No.: 924,779

[22] Filed: Oct. 30, 1986

[51] Int. Cl.⁴ ............................................. H05K 07/12
[52] U.S. Cl. ...................................... 361/419; 24/336;
  24/458; 174/138 D; 174/138 G; 248/221.3;
  248/229; 361/399; 361/415; 361/422; 361/427
[58] Field of Search .................. 174/138 D; 361/390,
  361/391, 399, 412, 413, 415, 417, 419, 422, 427;
  211/41; 358/254; 24/336, 458; 248/221.3, 229

[56] References Cited

U.S. PATENT DOCUMENTS

| | | | |
|---|---|---|---|
| 3,066,367 | 12/1962 | Garman | 361/427 X |
| 3,210,776 | 10/1965 | Cox | 24/236 X |
| 3,486,077 | 12/1969 | Oeler et al. | 361/399 X |
| 3,546,659 | 12/1970 | Powers | 361/391 X |
| 3,552,579 | 1/1971 | Simon et al. | 24/336 X |
| 3,848,952 | 11/1974 | Tighe | 174/138 D X |
| 3,996,500 | 12/1976 | Coules | 174/138 D X |
| 4,058,890 | 11/1977 | Pierce et al. | 174/68.5 X |
| 4,589,794 | 5/1986 | Sugiura et al. | 24/336 X |
| 4,644,614 | 2/1987 | Mizusawa | 174/138 D X |

Primary Examiner—R. R. Kucia
Attorney, Agent, or Firm—E. M. Whitacre; D. H. Irlbeck; T. H. Magee

[57] ABSTRACT

A latch for securing a printed circuit board adjacent one side of a television chassis wall comprises a T-shaped tongue having a stem connected at one end to the bottom of a plastic body, the other end of the stem adjoining a crossbar. The latch also includes a U-shaped groove disposed adjacent to the top of the body along a major surface thereof for receiving an edge of the printed circuit board. The chassis wall has a neck defined by two shoulders spaced apart to support, respectively, L-shaped arms connected to each side of the body at the bottom thereof. The tongue passes through a T-shaped aperture in the wall beneath the neck such that the crossbar contacts the side of the chassis wall opposite the one side, the aperture being shaped to allow the crossbar to pass therethrough before making contact with the opposite side of the chassis wall.

16 Claims, 9 Drawing Figures

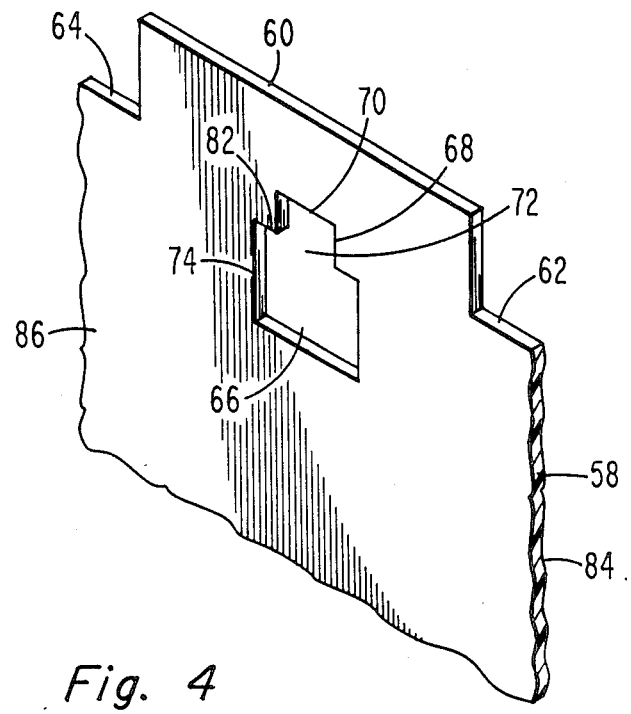
Fig. 4
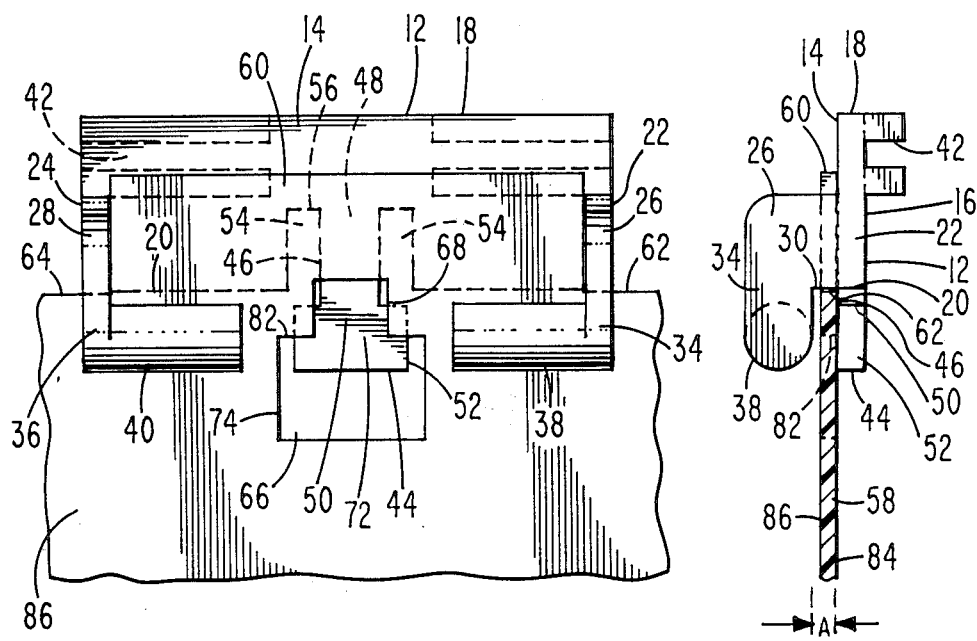
Fig. 5
Fig. 6

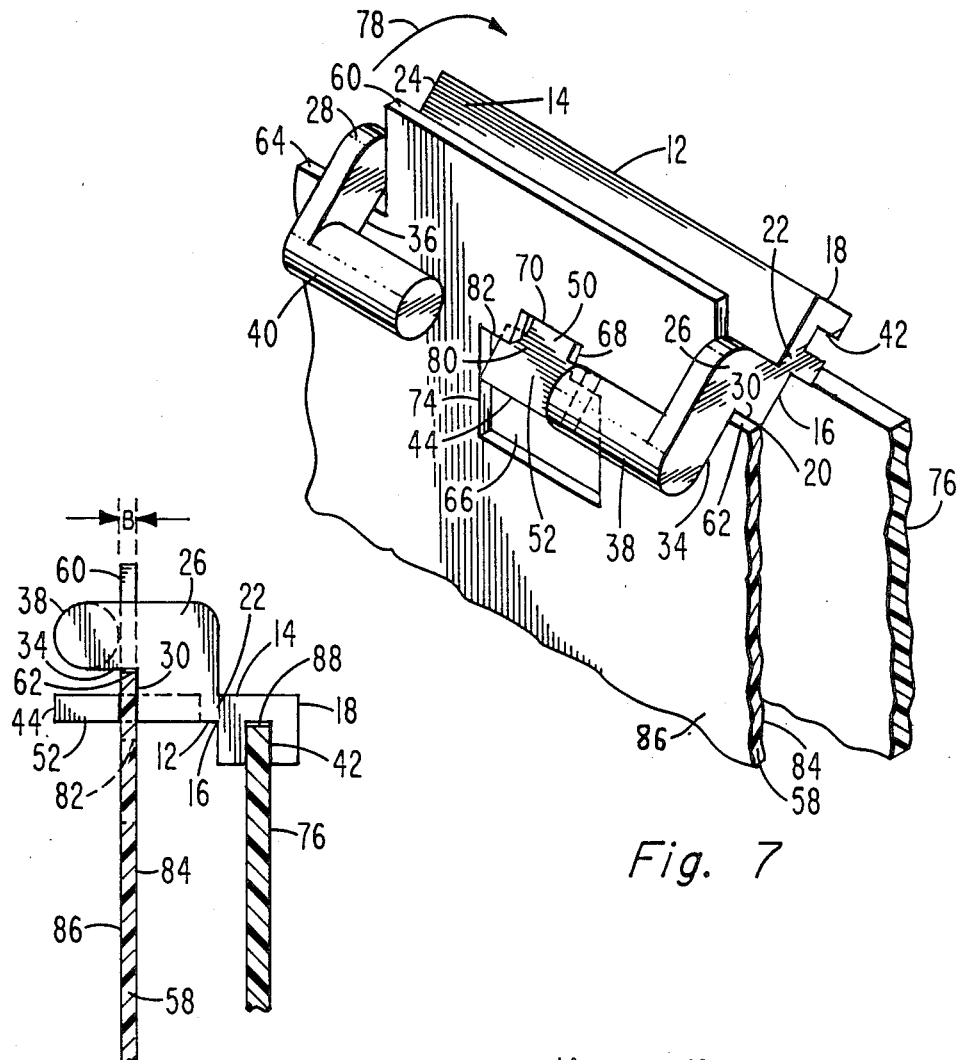
Fig. 7
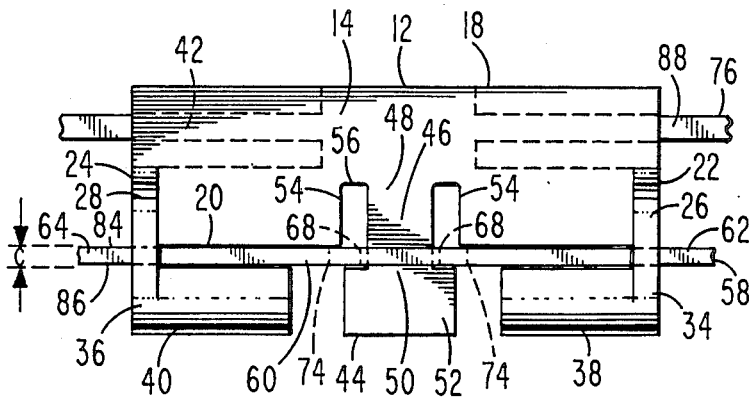
Fig. 8
Fig. 9

LATCH FOR PRINTED CIRCUIT BOARD

BACKGROUND OF THE INVENTION

This invention pertains to a latch for securing a printed circuit board adjacent a television chassis wall.

A television chassis comprises a support structure on which electronic components and their associated circuitry are mounted for assembly with a cathode-ray tube in manufacturing television receivers and video monitors. The television chassis is typically a sheetmetal box or frame whose structural parts are assembled to each other using conventional fasteners, such as screws and rivets. Additional fastening hardware is used to assemble the electronic components and associated circuitry, including printed circuit (PC) boards, to the supporting box or frame. Such a chassis utilizes many different types of fastening hardware and is relatively expensive to manufacture and service, due not only to the cost of the hardware itself but also to the difficulty and labor time required to assemble, access and repair the television receiver or monitor.

It is desirable to be able to secure a printed circuit board adjacent a television chassis using a one-piece molded latch requiring no fasteners for installation. Such a latch should be relatively inexpensive and have the ability to swing out of the way for easy printed circuit board removal.

SUMMARY OF THE INVENTION

The present invention comprises a one-piece latch for securing a printed circuit board adjacent a television chassis wall. The latch comprises a T-shaped tongue having a stem connected at one end to the bottom of a plastic body, the other end of the stem adjoining a crossbar. The latch also includes a U-shaped groove disposed adjacent to the top of the body along a major surface thereof for receiving an edge of the printed circuit board. The chassis wall has a neck defined by two shoulders spaced apart to support, respectivley, L-shaped arms connected to each side of the body at the bottom thereof. The tongue passes through a T-shaped aperture in the wall beneath the neck such that the crossbar contacts the side of the chassis wall opposite the one side, the aperture being shaped to allow the crossbar to pass therethrough before making contact with the opposite side of the chassis wall.

BRIEF DESCRIPTION OF THE DRAWING

FIG. 4 is a perspective view of part of a television chassis wall having an aperture for use in combination with the present PC board latch.

FIG. 5 is a front elevation view of the latch supported by the chassis wall prior to secruing a PC board.

FIG. 6 is a side elevation view of the latch supported by the chassis wall prior to securing a PC board.

FIG. 7 is a perspective view of the latch during rotation into cooperative locking combination with the chassis wall and a PC board.

FIG. 8 is a side elevation view of the latch in cooperative locking combination with the chassis wall and a PC board.

FIG. 9 is a plan view of the latch in cooperative locking combination with the chassis wall and a PC board.

DETAILED DESCRIPTION OF THE PREFERRED EMBODIMENT

Figure 1:
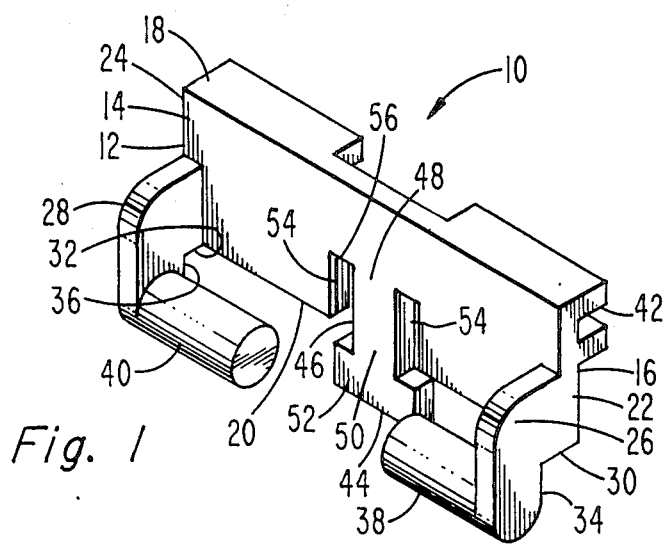
FIG. 1 is a perspective view of the present PC board latch.
Figure 2:
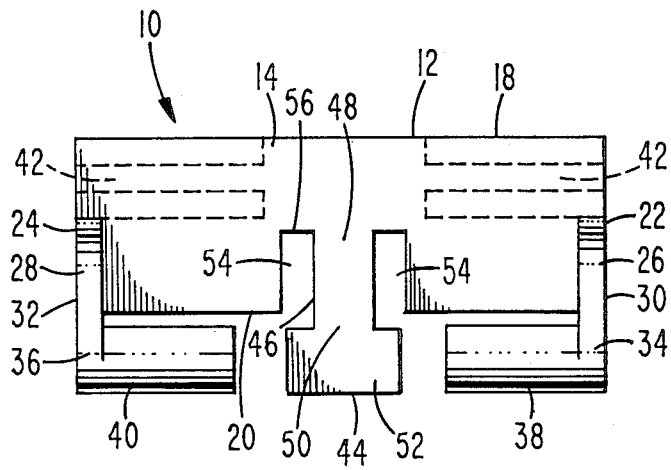
FIG. 2 is a front elevation view of the latch.
Figure 3:
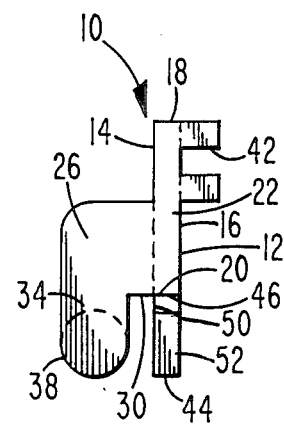
FIG. 3 is a side elevation view of the latch.

FIGS. 1 through 3 show a latch 10 for securing a printed circuit board (shown in FIGS. 7 through 9) adjacent a wall-like structure. The latch 10 comprises a body 12 having two major opposing surfaces 14 and 16 adjoining a top 18, a bottom 20, and two sides 22 and 24 of the body 12. Each side 22 and 24 of the body 12 includes an L-shaped arm 26 and 28, respectively, having one segment 30 and 32 integrally connected to the bottom of the body 12 so as to project away from one major surface 14 of the body 12. The other segment 34 and 36 of each arm 26 and 28, respectively, extends away from the top of the body 12 along a direction substantially parallel to the one major surface 14. Preferably, each of the other segments 34 and 36 has a contact bar 38 and 40, respectively, integrally connected thereto so as to orthogonally project therefrom.

Means are disposed adajcent to the top 18 of the body 12, along the major surface 16 opposite the one surface 14, for receiving an edge of the printed circuit board, as shown in FIGS. 8 and 9. In the present example, the receiving means comprises a substantially U-shaped groove 42 adapted to fit snugly over the edge of the printed circuit board.

The latch 10 also comprises a T-shaped tongue 44 having a resilient stem 46 integrally connected at one end 48 thereof to the bottom 20 of the body 12 so as to project away from the bottom 20 along a direction substantially parallel to the major surfaces 14 and 16. The other end 50 of the stem 46 adjoins a crossbar 52 disposed along a direction substantially orthogonal to the stem 46. Preferably, the bottom 20 of the body 12 has substantially U-shaped cutouts 54 therein on each side of the stem 46. The purpose of the cutouts 54 is to provide more resiliency to the stem 46, for reasons explained further below.

Ideally, the latch 10 comprises a single piece of injection-molded plastic. The body 12 and tongue 44 have a substantially flat shape, and each contact bar 38 and 40 has a cylindrical shape, as shown in FIG. 1.

FIG. 4 shows a wall-like structure 58 utilized in cooperative combination with the latch 10 for securing a printed cicuit board (shown in FIGS. 7 through 9) adjacent the wall-like structure 58. Typically, the wall-like structure 58 comprises a wall of a television chassis adjacent which a PC board is secured parallel thereto. The chassis wall 58 has a neck 60 defined by two shoulders 62 and 64 spaced apart to support, respectively, the arms 26 and 28 of the latch 10. The chassis wall 58 also has an aperture 66 disposed therein beneath the neck 60. The aperture 66 is positioned and shaped so as to allow the crossbar 52 of the tongue 44 to pass therethrough before making contact with the opposite side of the wall 58, as explained further below. In the present example, the aperture 66 is T-shaped and has a stem opening 68 with one end 70 thereof disposed adjacent the neck 60, and another end 72 opposite the one end 70. The opposite end 72 of the stem opening 68 is disposed away from the neck 60 and is adjoined to a crossbar opening 74. The width of the stem opening 68 is greater than the width of the tongue stem 46 but less than the length of the tongue crossbar 52.

FIGS. 5 and 6 show the latch 10 as initially supported by the chassis wall 58 prior to securing a PC board (shown in FIGS. 7 through 9). The two shoulders 62 and 64 support, respectively, the one segment 30 and 32 of each arm 26 and 28 at the vertex joining the two segments of each arm 26 and 28. The distance between the one major surface 14 of the body 12 and the other segments 34 and 36 of each arm 26 and 28, shown as distance A in FIG. 6, is slightly greater than the thickness of the chassis wall 58.

FIG. 7 shows the latch 10 during rotation into cooperative locking combination with the chassis wall 58 and a printed circuit board 76. While the one segment 30 and 32 of each arm 26 and 28 supports the body 12, the latch 10 is rotated about 90 degrees clockwise in a direction indicated by the arrow 78 in FIG. 7. As the latch 10 is rotated, the crossbar 52 of the tongue 44 enters the crossbar opening 74 of the aperture 66 in the wall 58, allowing one surface 80 of the crossbar 52 to make contact with the upper edge 82 of the crossbar opening 74. As the latch 10 continues to rotate, the upper edge 82 of the crossbar opening 74 forces the crossbar 52 downward, thereby bending the resilient stem 46 of the tongue 44 downward. During this rotation, the latch 10 actually pivots about the vertex joining the two segments of each arm 26 and 28 so as to allow the other segment 34 and 36 of each arm 26 and 28 to begin supporting the body 12. Near the end of this 90 degree rotation, the crossbar 52 passes through the opening 74, thereby allowing the crossbar 52 to clear the upper edge 82 of the opening 74. Simultaneously, the one segment 30 and 32 of each arm 26 and 28 comes into contact with one side 84 of the chassis wall 58. At this time, the resilient stem 46 snaps upward into the stem opening 68 of the aperture 66, and the crossbar 52 moves upward to make contact with the opposite side 86 of the wall 58, thereby allowing the latch 10 to assume a locked orientation wherein the groove 42 is positioned over an edge 88 of the PC board 76.

FIGS. 8 and 9 show the orientation of the latch 10 in cooperative locking combination with the chassis wall 58 and the PC board 76. The one segment 30 and 32 of each arm 26 and 28 rests against the one side 84 of the chassis wall 58, and each contact bar 38 and 40 abuts against the neck 60 adjacent the opposite side 86 of the wall 58, as shown in FIG. 8. The latch 10 is configured so that the distance between each contact bar 38 and 40 and the one segment 30 and 32 of each arm 26 and 28, shown as distance B in FIG. 8, is substantially equal to the thickness of the wall 58. In the locked position, the tongue 44 is disposed through the aperture 66 sufficiently to allow the crossbar 52 to contact the opposite side 86 of the wall 58. The distance between the crossbar 52 and the bottom 20 of the body 12, shown as distance C in FIG. 9, is substantially equal to the thickness of the wall 58. In this orientation, the latch 10 is held in a locked position by the chassis wall 58 while the groove 42 fits snugly over the edge 88 of the PC board 76, thereby securely holding the PC board 76 in a fixed position.

The present one-piece latch 10 requires no fasteners for installation in the chassis wall 58, and easily swings out of the way for quick removal of the PC board 76. Since the latch 10 may be made of injectionmolded plastic, it is also relatively inexpensive to manufacture.

What is claimed is:

1. A latch for securing a printed circuit board adjacent a structure comprising:

a body having two major opposing surfaces adjoining a first portion, a second portion opposite said first portion, and two additional portions of said body opposite each other between said first and second portions, each additional portion including an L-shaped arm having one segment integrally connected to the second portion of said body so as to project away from one major surface of said body, the other segment of each arm extending away from the first portion of said body along a direction substantially parallel to said one major surface, means disposed adjacent to the first portion of said body along the major surface opposite said one surface for receiving an edge of said printed circuit board, and a T-shaped tongue having a stem integrally connected at one end thereof to the second portion of said body so as to project away from said second portion along a direction substantially parallel to said major surfaces, the other end of said stem adjoining a crossbar disposed along a direction substantially orthogonal to said stem.

2. A latch as defined in claim 1 wherein each of said other segments has a contact bar integrally connected thereto so as to orthogonally project therefrom.

3. A latch as defined in claim 2 wherein said body and said tongue have a substantailly flat shape, and wherein each contact bar has a cylindrical shape.

4. A latch as defined in claim 3 wherein the distance between each contact bar and the one segment of its supporting arm is substantially equal to the thickness of said structure.

5. A latch as defined in claim 3 wherein the distance between said crossbar and the second portion of said body is substantially equal to the thickness of said structure.

6. A latch as defined in claim 5 wherein the second portion of said body has substantially U-shaped cutouts therein adjacent said stem.

7. A latch as defined in claim 2 wherein said receiving means comprises a substantially U-shaped groove adapted to fit snugly over the edge of said printed circuit board.

8. A latch as defined in claim 2 wherein said latch comprises a single piece of injection-molded plastic.

9. A latch in cooperative locking combination with a structure for securing a printed circuit board adjacent thereto comprising:

a body having two major opposing surfaces adjoining a first portion, a second portion opposite said first portion, and two additional portions of said body opposite each other between said first and second portions, each additional portion including an L-shaped arm having one segment integrally connected to the second portion of said body so as to project away from one major surface of said body, the other segment of each arm extending away from the first portion of said body along a direction substantially parallel to said one major surface and having a contact bar integrally connected thereto so as to orthogonally project therefrom, means disposed adjacent to the first portion of said body along the major surface opposite said one surface for receiving an edge of said printed circuit board, a T-shaped tongue having a stem integrally connected at one end thereof to the second portion of said body so as to project away from said second portion along a direction substantially parallel to said major surfaces, the other end of said stem adjoining a crossbar disposed along a direction substantialy orthogonal to said stem, said structure having a neck defined by two shoulders spaced apart to support said arms, respectively, at the vertex joining the two segments of each arm in an orientation whereat said one segment rests against one side of said structure, and each contact bar abuts against said neck adjacent the side of said structure opposite said one side, said tongue passing through an aperture disposed in said structure beneath said neck such that said crossbar contacts said opposite side, said aperture being shaped so as to allow said crossbar to pass therethrough before making contact with said opposite side.

10. A latch in combination with a structure as defined in claim 9 wherein said aperture is T-shaped and has a stem opening with one end thereof disposed adjacent said neck and another end opposite said one end disposed away from said neck and adjoined to a crossbar opening, the width of said stem opening being greater than the width of said stem but less than the length of said crossbar.

11. A latch in combination with a structure as defined in claim 10 wherein said body and said tongue have a substantially flat shape, and wherein each contact bar has a cylindrical shape.

12. A latch in combination with a structure as defined in claim 11 wherein the distance between each contact bar and the one segment of its supporting arm is substantialy equal to the thickness of said structure.

13. A latch in combination with a structure as defined in claim 11 wherein the distance between said crossbar and the second portion of said body is substantially equal to the thickness of said structure.

14. A latch in combination with a structure as defined in claim 13 wherein the bottom of said body has substantially U-shaped cutouts therein adjacent said stem.

15. A latch in combination with a structure as defined in claim 10 wherein said receiving means comprises a substantially U-shaped groove adapted to fit snugly over the edge of said printed circuit board.

16. A latch in combination with a structure as defined in claim 10 wherein said latch comprises a single piece of injection-molded plastic and wherein said structure comprises a wall of a television chassis.

* * * * *